(12) United States Patent
Murayama et al.

(10) Patent No.: US 6,548,330 B1
(45) Date of Patent: Apr. 15, 2003

(54) SEMICONDUCTOR APPARATUS AND METHOD OF FABRICATING SEMICONDUCTOR APPARATUS

(75) Inventors: Toshihiro Murayama, Kanagawa (JP); Masuo Kato, Aichi (JP); Yasufumi Tatsuno, Tokyo (JP)

(73) Assignee: Sony Corporation, Tokyo (JP)

( * ) Notice: Subject to any disclaimer, the term of this patent is extended or adjusted under 35 U.S.C. 154(b) by 51 days.

(21) Appl. No.: 09/715,557

(22) Filed: Nov. 17, 2000

(30) Foreign Application Priority Data

Nov. 17, 1999 (JP) ............................................. 11-327400

(51) Int. Cl.[7] ............................................. H01L 21/44
(52) U.S. Cl. ...................... 438/127; 438/112; 438/124; 438/126; 438/977; 257/686; 257/787
(58) Field of Search ................................. 438/108, 111, 438/112, 124, 125, 126, 127, 977, 459; 257/778, 787, 773, 774, 685, 686, 687

(56) References Cited

U.S. PATENT DOCUMENTS

| | | | |
|---|---|---|---|
| 5,578,525 A | * | 11/1996 | Mizukoshi .................. 438/125 |
| 5,580,795 A | * | 12/1996 | Schimert et al. .............. 438/94 |
| 5,909,058 A | * | 6/1999 | Yano et al. .................. 257/703 |
| 6,188,127 B1 | * | 2/2001 | Senba et al. ................. 257/778 |
| 6,204,562 B1 | * | 3/2001 | Ho et al. ..................... 257/778 |
| 6,287,892 B1 | * | 9/2001 | Takahashi et al. ........... 438/126 |
| 6,324,067 B1 | * | 11/2001 | Nishiyama ................... 257/778 |
| 6,350,954 B1 | * | 2/2002 | Specks et al. ............... 257/778 |

* cited by examiner

Primary Examiner—Kevin M. Picardat
(74) Attorney, Agent, or Firm—Robert J. Depke; Holland & Knight LLC

(57) ABSTRACT

To be capable of arbitrarily designing an interconnection shape of a surface layer to thereby promote reliability of connection in laminating layers and making destruction of a semiconductor element difficult to cause in a semiconductor apparatus having interconnections for connecting laminated layers on a surface and a back of a substrate and capable of laminating layers in multiple stages, a semiconductor apparatus is fabricated by a step of mounting a semiconductor element in a recess portion shallower than a thickness of a semiconductor element formed in a surface of a substrate having interconnection patterns connected by a through hole on two of the surface and a back in which a thickness of an interconnection on the surface is made thicker than a thickness of an interconnection on the back with a front thereof disposed on the lower side, a step of sealing the semiconductor element in the recess portion by synthetic resin and a step of grinding the substrate and the semiconductor element up to the interconnection on the surface.

5 Claims, 10 Drawing Sheets

SEMICONDUCTOR APPARATUS AND METHOD OF FABRICATING SEMICONDUCTOR APPARATUS

RELATED APPLICATION DATA

The present application claims priority to Japanese Application No. P11-327400 filed Nov. 17, 1999, which application is incorporated herein by reference to the extent permitted by law.

BACKGROUND OF THE INVENTION

1. Field of the Invention

The present invention relates to a new semiconductor apparatus and a method of fabricating a semiconductor apparatus. More in details, the present invention relates to a technology capable of arbitrarily designing an interconnection shape of a surface layer to thereby promote reliability of connection in laminating layers and making destruction of a semiconductor element difficult to cause in a semiconductor apparatus having interconnections for connecting laminated layers on a surface and a back of a substrate and capable of laminating layers in multiple stages.

2. Description of the Related Art

In recent years, in addition to an increase in a necessary amount of a semiconductor memory dealt with by electronic apparatus, downsizing of electronic apparatus has been progressed and accordingly, it has been desired to mount a semiconductor memory having a large capacity by mounting area and volume which are made as small as possible.

Hence, there have been proposed various methods of constituting large capacity formation by using a plurality of pieces of semiconductor memories.

First, there is provided a constitution of laminating a plurality of pieces of semiconductor memories which have already been fabricated as semiconductor packages. However, since a thickness of the semiconductor package per se is thick and accordingly, when the semiconductor packages are laminated in multiple stages, there poses a problem in which a thickness of a total thereof becomes considerably thickened.

Further, there also has been proposed a structure of thinning the thickness by using a TAB tape. However, there poses a problem in which the TAB tape is generally expensive and is difficult to deal with.

Further, there also has been carried out a trial of thinning a thickness of a semiconductor element to be mounted. However, there poses a serious problem in view of dealing therewith such as crack of a wafer in transportation or a serious problem in view of inspection and integration thereof.

Hence, in order to realize a semiconductor memory package which is as thin as possible, it is effective to thin a semiconductor element after mounting the semiconductor element on a carrier such as a substrate. There are disclosed, in Japanese Patent Laid-Open No. 236694/1996, examples of semiconductor memories in each of which a total thickness in laminating layers in multiple stages is restrained to be thin by constituting the semiconductor memory in this way. These examples are shown in FIGS. 13A, 13B, 13C, 13D and 13E and FIGS. 14A, 14B, 14C and 14D.

According to the example shown in FIGS. 13A, 13B, 13C, 13D and 13E, there is used a substrate 'a' constituted by electrically connecting a conductor pattern formed on a surface of the substrate 'a' and an inner bonding pad formed on a back of the substrate 'a' by a through hole formed at an inner portion or at an end face of the substrate 'a'. A semiconductor element 'b' is mounted on the surface of the substrate 'a' (refer to FIG. 13 A). Synthetic resin 'c' is injected between the substrate 'a' and the semiconductor element 'b' to thereby seal therebetween (refer to FIG. 13 B). The semiconductor element 'b' is polished and ground to a desired thickness (refer to FIG. 13 C). One unit 'e' is formed by forming bumps 'd' for laminating layers in multiple stages (refer to FIG. 13 D). By laminating such units 'e' in multiple stages, a memory module 'f' having a large capacity is formed (refer to FIG. 13 E).

According to the example shown in FIGS. 14A, 14B, 14C and 14D, a cavity portion 'g' is provided, further, a substrate 'i' having end face through holes 'h' is used. First, a semiconductor element 'j' is mounted at inside of the cavity portion 'g' (refer to FIG. 14 A). Synthetic resin 'k' is injected between the substrate 'i' and the semiconductor element 'j' to thereby seal therebetween (refer to FIG. 14 B) A total including the semiconductor element 'j' is polished and ground to a desired thickness to thereby form on e unit 'l' (refer to FIG. 14 C). By laminating such units 'l' in multiple stages and connecting the units 'l' by the end face through holes 'h' a memory module 'm' having a large capacity is formed (refer to FIG. 14 D).

According to th e above-described related examples, in grinding the semiconductor element from the back, it is difficult to leave interconnections formed on the surface of the substrate. Further, it is difficult to bond together the end face through holes 'h' of the substrates 'i' laminated in multiple stages as in the example shown in FIGS. 14A, 14B, 14C and 14D and even when the end face through holes 'h' can be bonded, a sufficient bond strength is not be achieved.

Further, in polishing and grinding the semiconductor element 'b' or 'j' on the back, the back of the semiconductor element 'b' or 'j' is not protected and accordingly, stress of polishing and grinding is directly exerted to the semiconductor element 'b' or 'j' and there is a concern of causing chipping or chip crack at the semiconductor element 'b' or 'j'.

SUMMARY OF THE INVENTION

Hence, it is the object of the present invention to be capable of arbitrarily designing an interconnection shape of a surface layer to thereby promote reliability of connection in laminating layers and making destruction of a semiconductor element difficult to cause in a semiconductor apparatus having interconnections for connecting laminated layers on a surface and a back of a substrate and capable of laminating layers in multiple stages.

In order to achieve the above-described object of the present invention, there is provided a semiconductor apparatus, wherein a semiconductor element is mounted in a recess portion formed at a surface of a substrate having interconnection patterns connected by a through hole on two of the surface and a back thereof with a front thereof disposed on a lower side, a semiconductor element is sealed in the recess portion by a synthetic resin, and a back of the semiconductor element and the interconnection on the front are disposed in a same plane.

Therefore, according to the semiconductor apparatus of the present invention, the interconnection pattern is formed on the front to dispose in a plane the same as that of the back of the semiconductor element and accordingly, the interconnection pattern on the front can be arbitrarily designed and reliability of connection in laminating layers is enhanced. Further, the semiconductor element is mounted by disposing the front to the lower side and accordingly, a thickness of a total can be thinned by grinding the back.

Further, in order to achieve the above-described object of the present invention, there is provided a method of fabricating a semiconductor apparatus comprising a step of mounting a semiconductor element by disposing the front on the lower side in a recess portion shallower than a thickness of the semiconductor element, the recess portion being formed in a surface of a substrate having interconnection patterns connected by a through hole on two of the surface and a back thereof in which a thickness of an interconnection on the surface is made thicker than a thickness of an interconnection on the back, a step of sealing the semiconductor element in the recess portion by a synthetic resin and a step of grinding the substrate and the semiconductor element up to the interconnection on the surface.

Therefore, according to the method of fabricating a semiconductor apparatus of the present invention, the semiconductor element is mounted by disposing the front on the lower side and accordingly, the thickness of the total can be thinned by grinding the thickness from the back. Further, the thickness of the interconnection on the front is made thicker than the thickness of the interconnection of the back and accordingly, when there causes a dispersion in a thickness of the substrate, even by grinding the interconnection such that the thickness of the total becomes the same, the interconnection can firmly be exposed to the front and reliability in connection can be promoted.

DETAILED DESCRIPTION OF PREFERRED EMBODIMENTS

An explanation will be given of embodiments of a semiconductor apparatus and a method of fabricating a semiconductor apparatus according to the present invention in reference to the attached drawings as follows.

Figure 1:
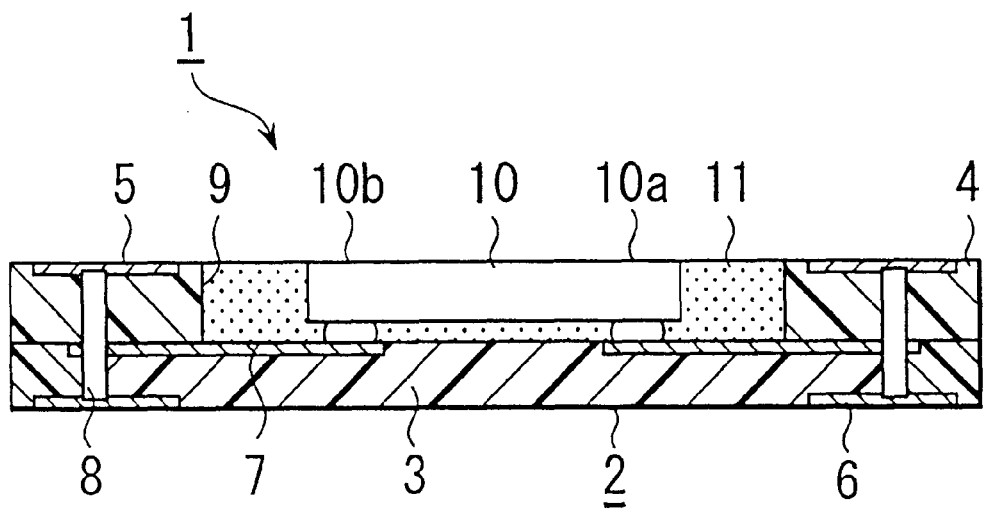
FIG. 1 shows embodiments of a semiconductor apparatus and a method of fabricating a semiconductor apparatus according to the present invention along with FIG. 2 through FIG. 12 and the drawing is an outline sectional view of a semiconductor apparatus.

FIG. 1 shows a semiconductor apparatus 1.

According to a substrate 2, a second layer 4 is formed on a first layer 3 and a surface interconnection 5 formed on the second layer, a back interconnection 6 of the first layer 3 and an interconnection 7 of a semiconductor element mounting portion on the first layer 3 are connected via a through hole 8. Further, there is formed a recess portion 9 reaching the first layer 3 in the second layer 4 and the recess portion 9 constitutes the semiconductor element mounting portion.

Further, a semiconductor element 10 is mounted above the interconnection 7 in the recess portion (semiconductor element mounting portion) 9 by so-to-speak face down bonding, that is, in a state in which a front thereof is disposed on the lower side, synthetic resin 11 is filled between the semiconductor element 10 and the recess portion 9 and side faces of the semiconductor element 10 are brought into a state of being completely covered by the synthetic resin 11. Further, a back 10a, the surface interconnection 5 and an upper face of the second layer 4 of the semiconductor element 10 are brought into a state of being disposed on the same plane.

An explanation will be given of a method of fabricating the semiconductor apparatus 1 in reference to FIG. 2 through FIG. 6.

Figure 2:
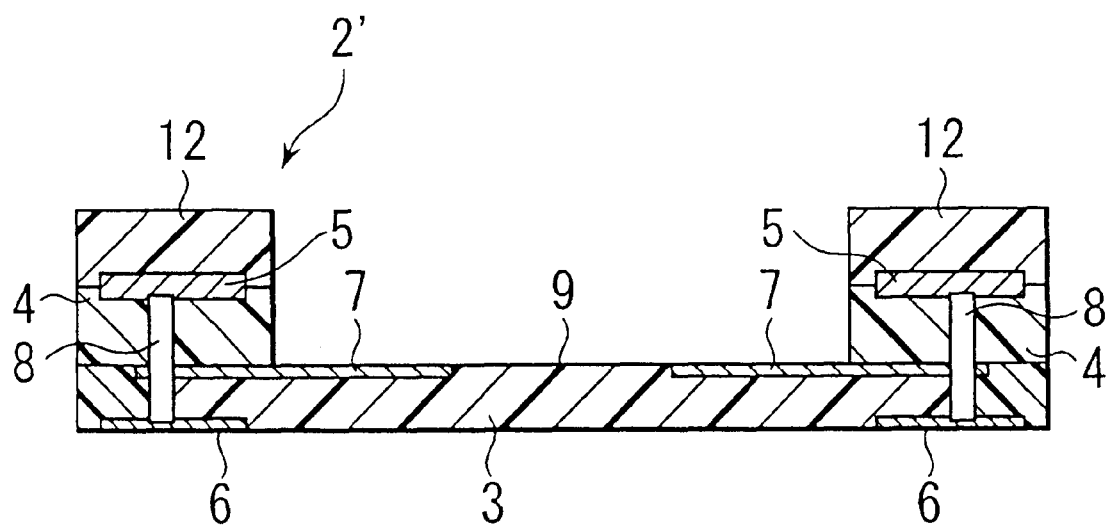
FIG. 2 is an outline sectional view showing an embodiment of a method of fabricating a semiconductor apparatus according to the present invention along with FIG. 3 through FIG. 7 and the drawing shows a substrate.

First, abase substrate 2' is prepared (refer to FIG. 2)

The base substrate 2' is formed with a third layer 12 on the second layer other than the first layer 3 and the second layer 4. Further, interconnections are not provided to the third layer 12. A thickness of the second layer 4 is constituted by a thickness equal to a thickness of the semiconductor element 10 after grinding the back after being mounted to the base substrate 2'. Further, a thickness of the third layer 12 is set such that a height thereof is higher than a height from a surface of the second layer 4 of the mounted semiconductor element 10 slightly by H2.

Figure 7:
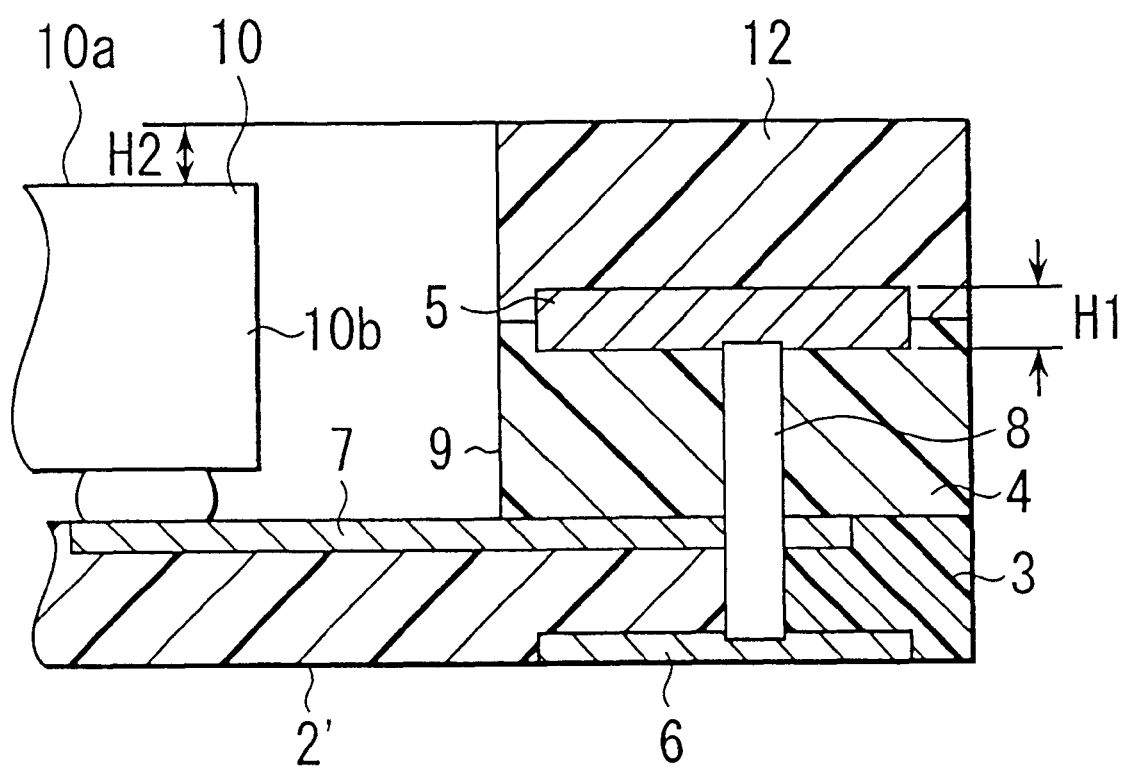
FIG. 7 shows VII portion of FIG. 3 by enlarging the portion.

A thickness H1 of the surface interconnection 5 on the second layer 4, is made thicker than a thickness of the back interconnection 6 of the first layer 3 and a thickness of the interconnection 7 of the semiconductor element mounting portion (refer to FIG. 7). Such constitution is necessary for exposing the interconnection 5 firmly in the surface by absorbing dispersions in the thicknesses of respective layers 3 and 4 of the substrate. Therefore, normally, a thickness of about 0.05 through 0.2 mm is needed for the surface interconnection 5.

Figure 3:
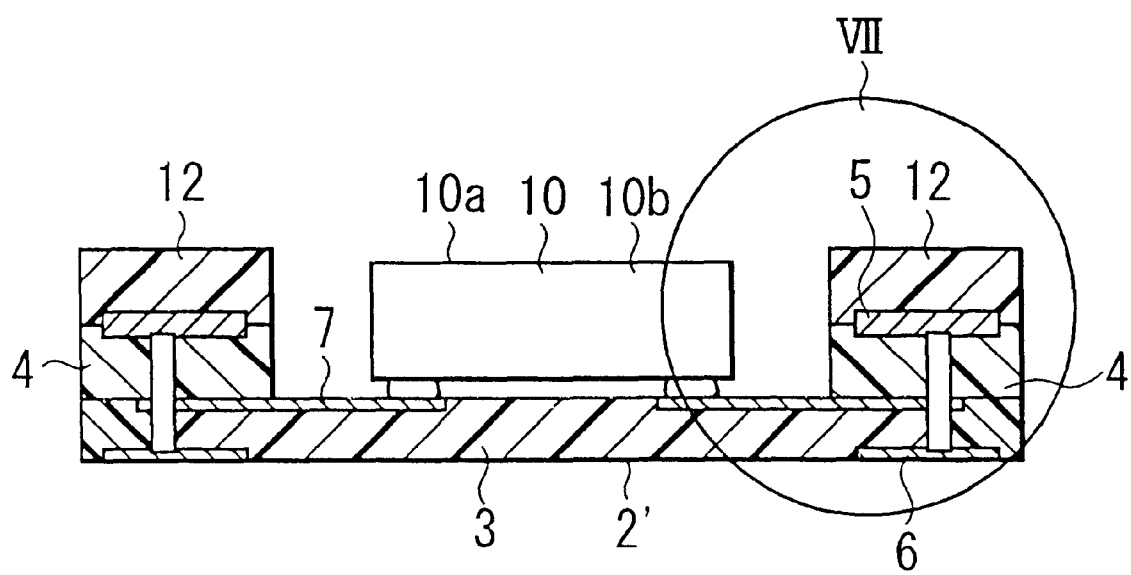
FIG. 3 shows a step of mounting a semiconductor element on a substrate.

Then, the semiconductor element 10 is mounted at inside of the recess portion 9 by face down bonding (refer to FIG. 3).

Figure 4:
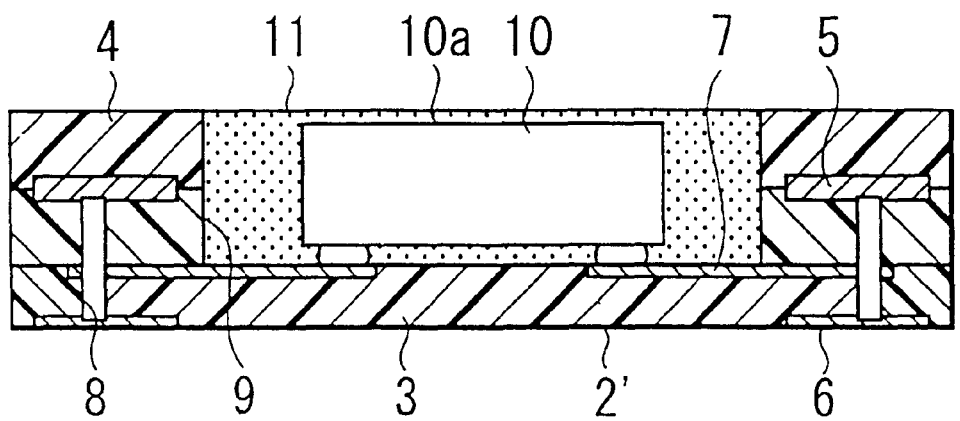
FIG. 4 shows a step of sealing a semiconductor element by synthetic resin.

Next, a synthetic resin 11 is injected into the recess portion 9 (refer to FIG. 4). It is necessary to provide an amount of the synthetic resin 11 to be injected such that at least side faces 10b of the mounted semiconductor element 10 are completely covered by the synthetic resin 11. Thereby, almost no stress is exerted to the semiconductor element 10 in a step of grinding the back 10a of the semiconductor element 10 at a successive step and so-to-speak chipping or chip crack can be prevented from causing. Further, according to the embodiment, the synthetic resin 11 is injected until the semiconductor element 10 is completely covered.

Figure 5:
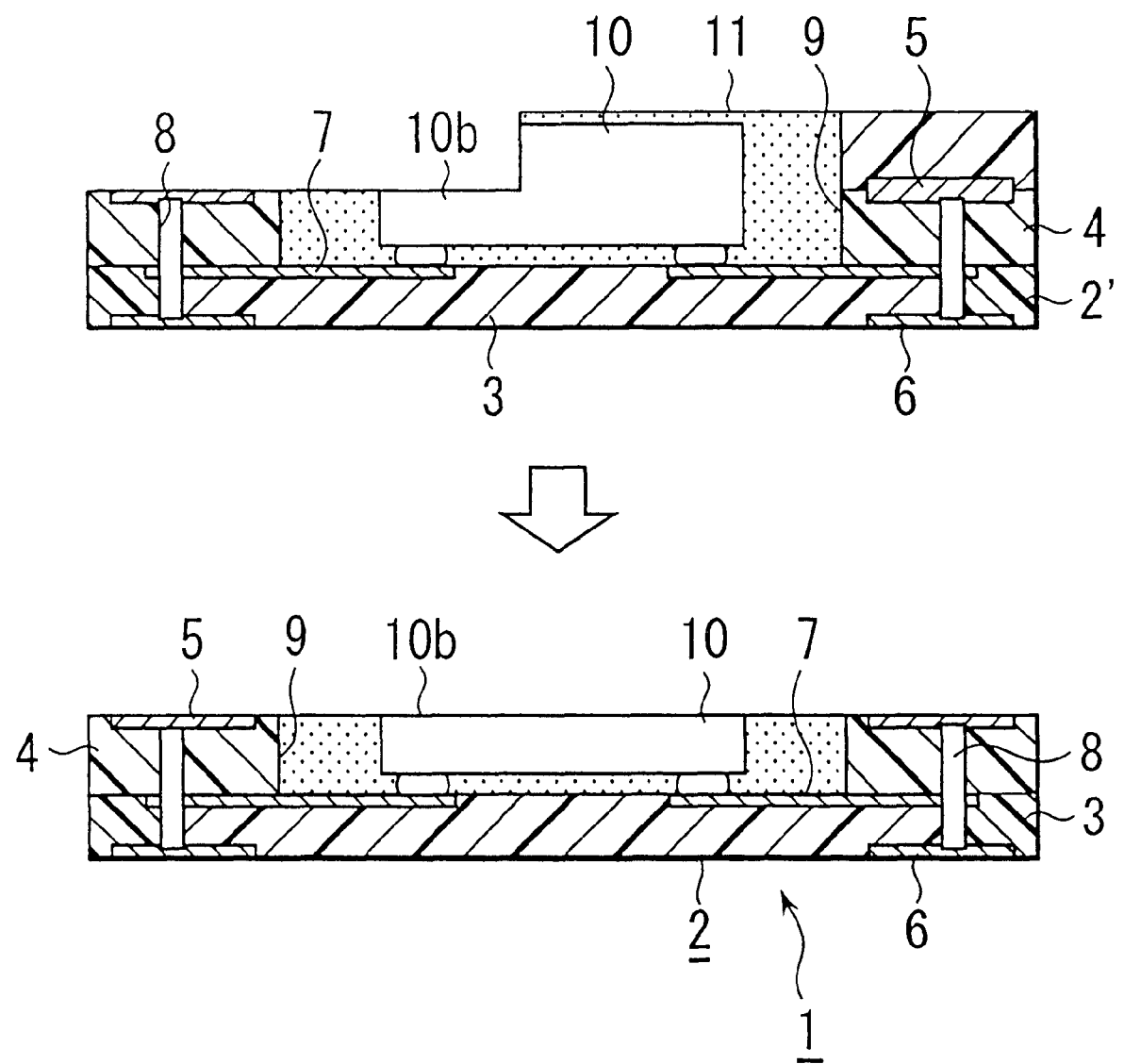
FIG. 5 shows a state in the midst of grinding and a state after grinding in a grinding step for thinning a thickness of a total.
Figure 6:
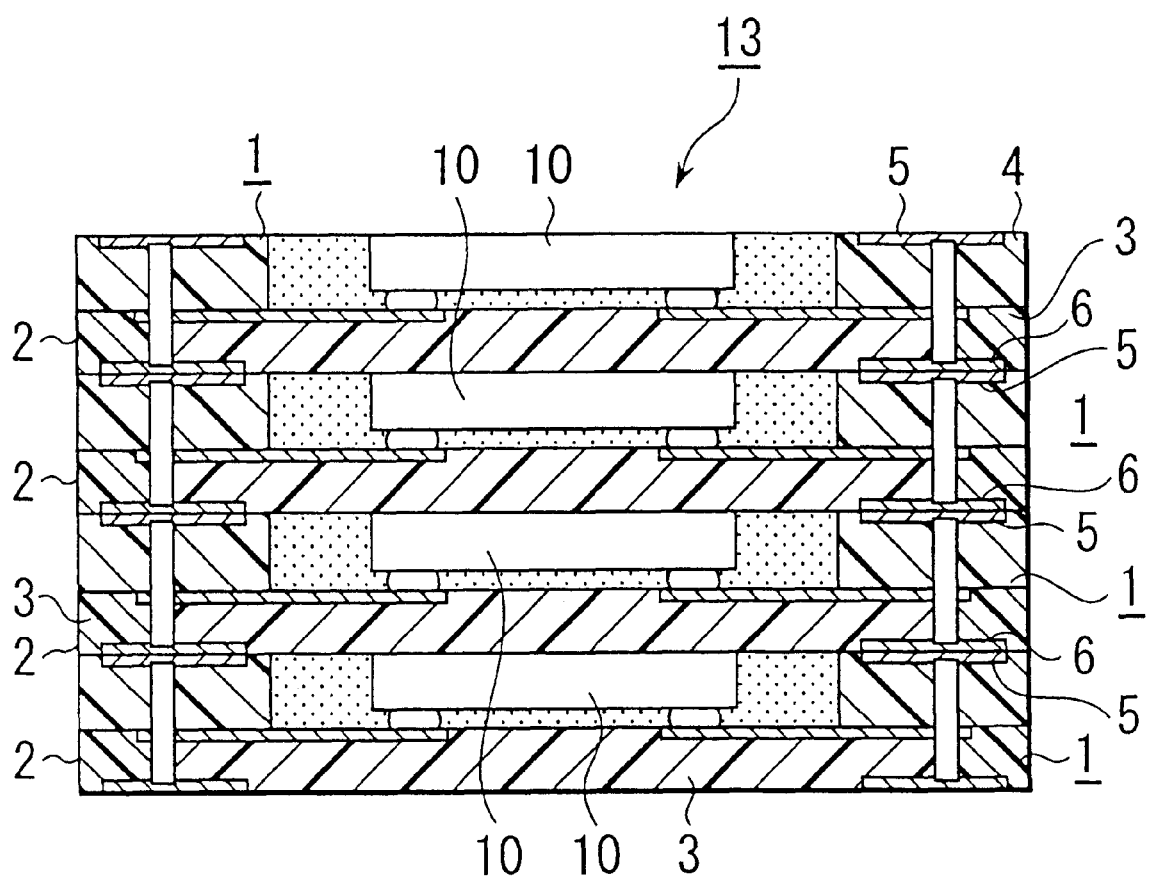
FIG. 6 shows a state of laminating a plurality of semiconductor apparatus.

Next, the third layer 12, the synthetic resin 11 and the semiconductor element 10 are polished and ground from a side of the back 10a of the semiconductor element 10 until the surface interconnection 5 is exposed (refer to FIG. 5). Further, etching or the like is carried out when needed.

Further, the semiconductor apparatus 1 is finished by carrying out nickel (Ni) plating, gold (Au) plating or solder plating on the surface interconnection 5 exposed at the surface.

Then, when the above-described semiconductor apparatus 1 are laminated in multiple stages and the surface interconnections 5 and the back interconnections 6 of the respective semiconductor apparatus 1 are physically and electrically connected by solder or conductive resin, a multiple stage laminated semiconductor apparatus 13 can be formed.

An explanation will be given of other method of fabricating the semiconductor apparatus 1 in reference to FIG. 8 through FIG. 12.

Figure 8:
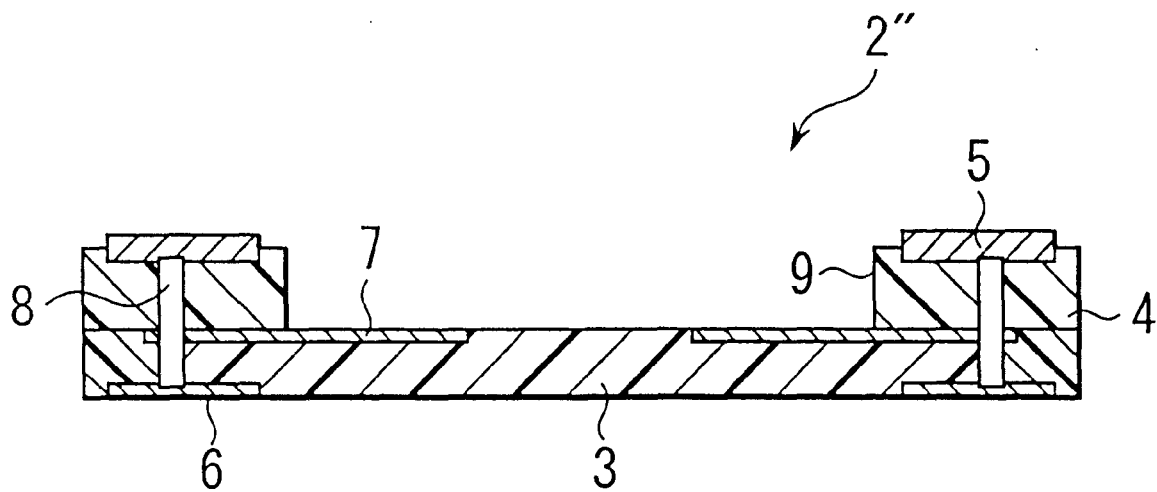
FIG. 8 is an outline sectional view showing other embodiment of a method of fabricating a semiconductor apparatus along with FIG. 9 through FIG. 12 and the drawing shows a substrate.

First, a base substrate 2" is prepared (refer to FIG. 8)

The base substrate 2" is constituted by two layers of the first layer 3 and second layer 4. The constitution of having the surface interconnection 5, the back interconnection 6, the interconnection 7 of the semiconductor element mounting portion, the through hole 8 and the recess portion 9 is similar to that of the base substrate 2", described above. The constitution of forming the thickness of the surface interconnection 5 thicker than those of the other interconnections 6 and 7 is similar to that of the base substrate 2", describe above.

Figure 9:
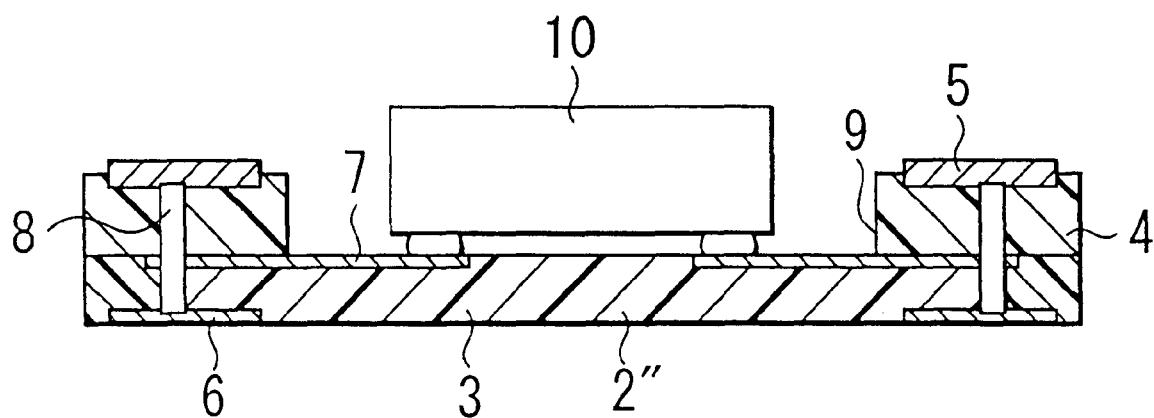
FIG. 9 shows a step of mounting a semiconductor element on a substrate.

Then, the semiconductor element 10 is mounted at inside of the recess portion 9 by face down bonding (refer to FIG. 9).

Figure 10:
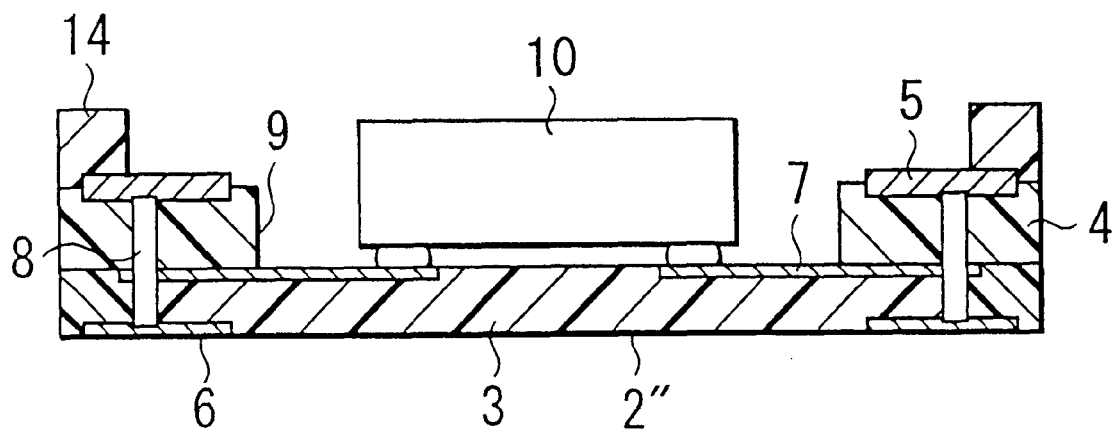
FIG. 10 shows a step of coating to overlap synthetic resin on a second layer of a substrate.

Next, synthetic resin 14 having comparatively significant thixotropy is coated at a surrounding portion of the surface of the second layer 4 (refer to FIG. 10). A height of the synthetic resin 14 is set to be slightly higher than the height of the mounted semiconductor element 10. Further, by constituting the synthetic resin 14 by a synthetic resin of a curing system similar to that of the synthetic resin 11 injected into the recess portion 9 at a next step, shortening of a curing time period can be achieved.

Figure 11:
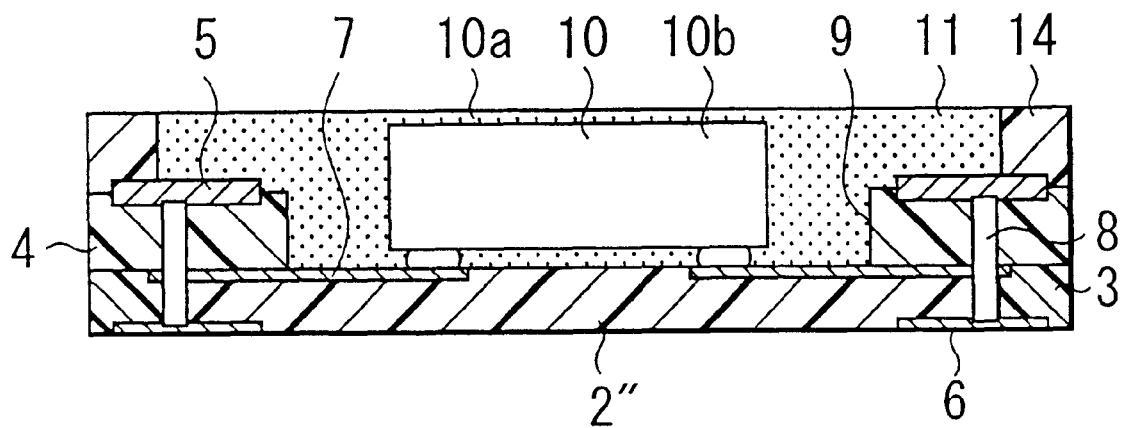
FIG. 11 shows a step of sealing a semiconductor element by synthetic resin.

Next, the synthetic resin 11 is injected into a recess portion formed by the recess portion 9 and the synthetic resin 14 (refer to FIG. 11). Thereby, the semiconductor element 10 is completely covered by the synthetic resin 11.

Figure 12:
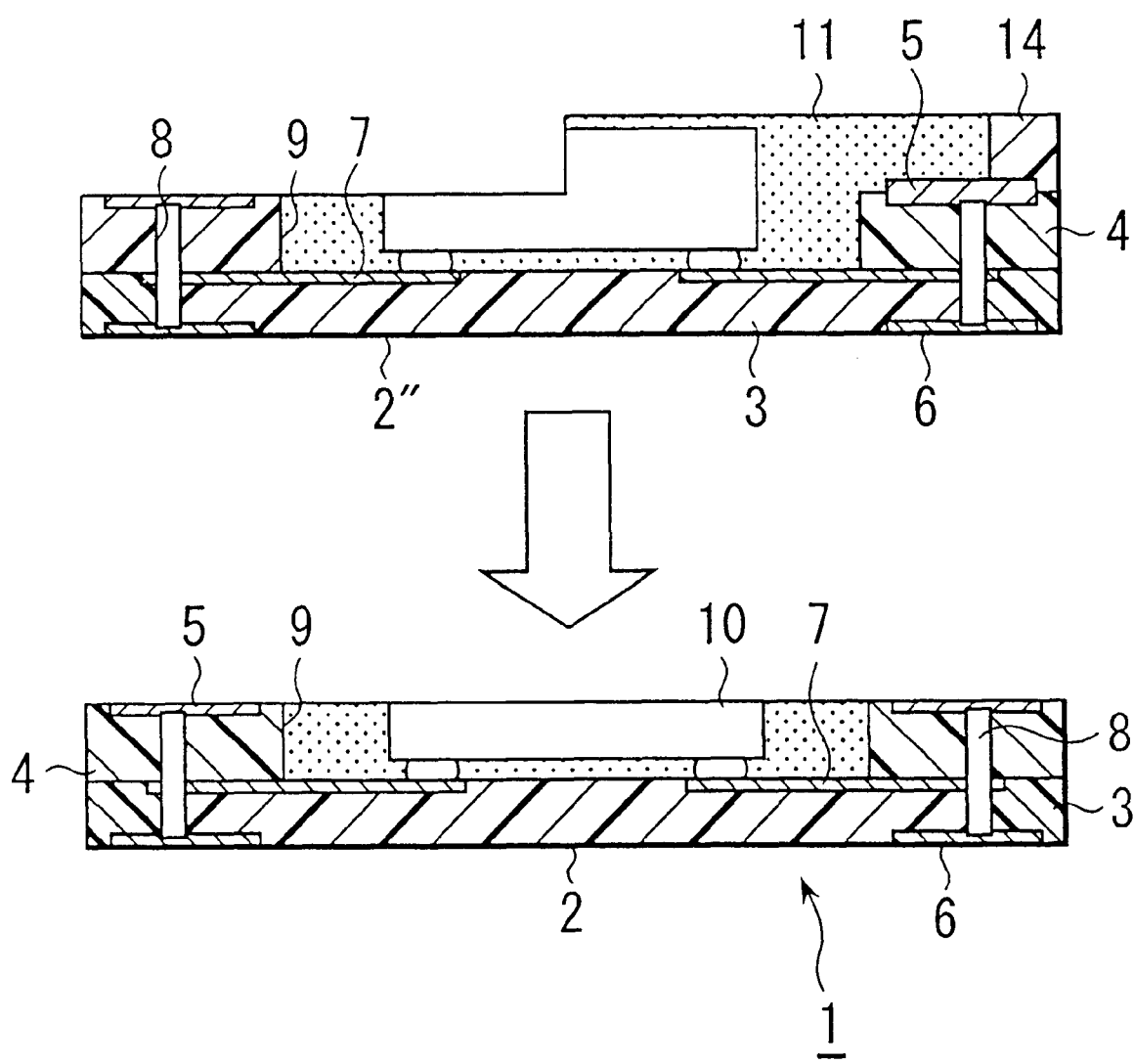
FIG. 12 shows a state in the midst of grinding and a state after grinding in a grinding step for thinning a thickness of a total.
Figure 13A:
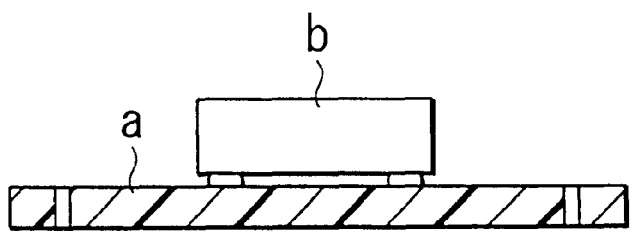
FIGS. 13A, 13B, 13C, 13D and 13E are outline sectional views for explaining an example of a related method of fabricating a semiconductor apparatus from FIG. 13A to FIG. 13E in this order.
Figure 13B:
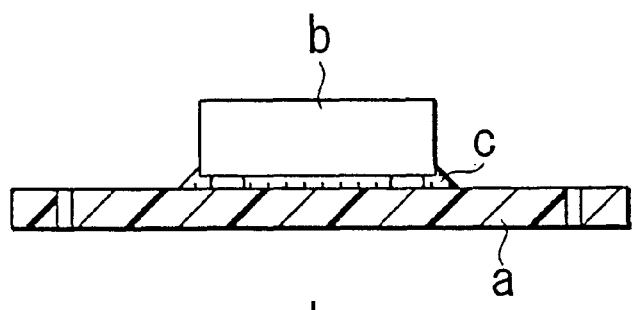
Figure 13C:
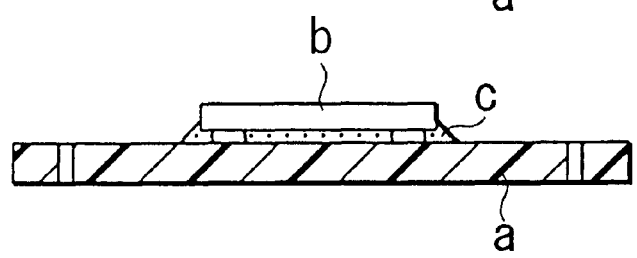
Figure 13D:
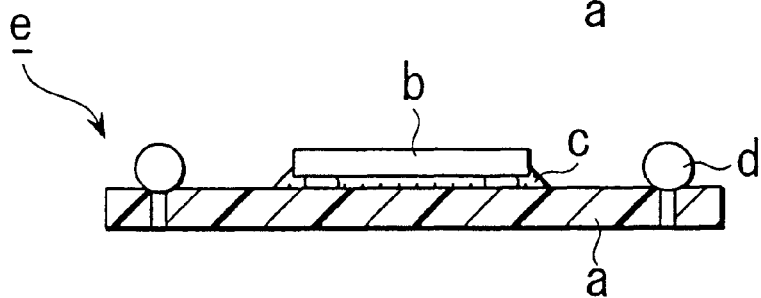
Figure 13E:
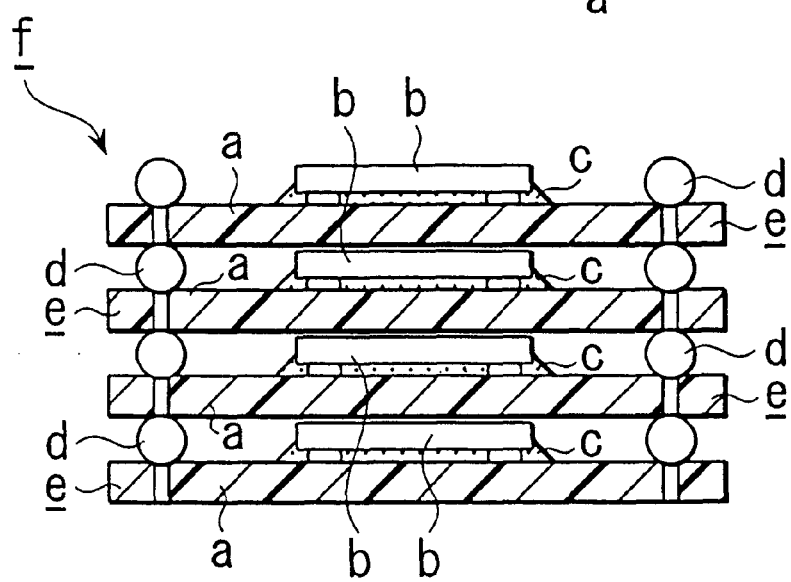
Figure 14A:
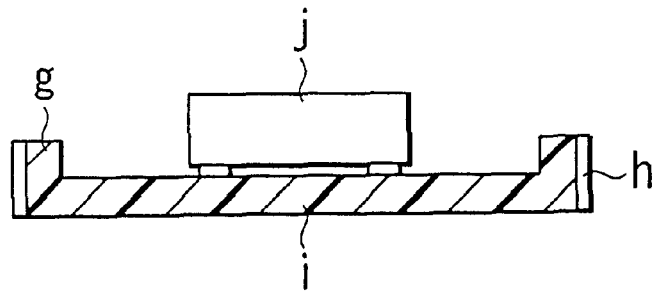
FIGS. 14A, 14B, 14C and 14D are outline sectional views for explaining other example of a related method of fabricating a semiconductor apparatus from FIG. 14A to FIG. 14D in this order.
Figure 14B:
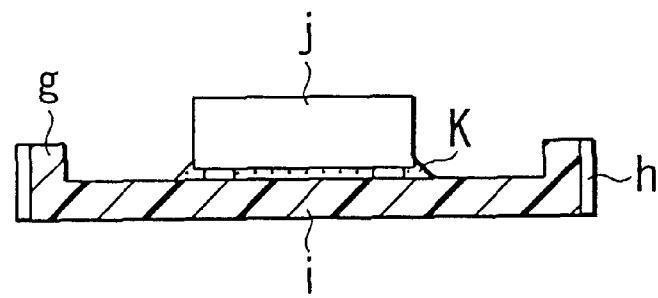
Figure 14C:
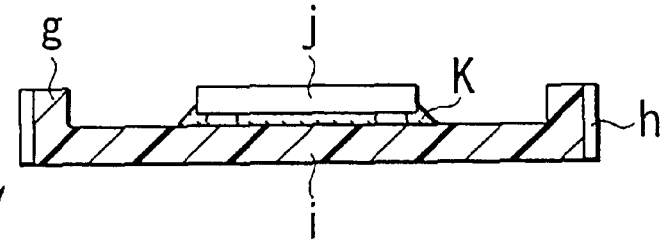
Figure 14D:
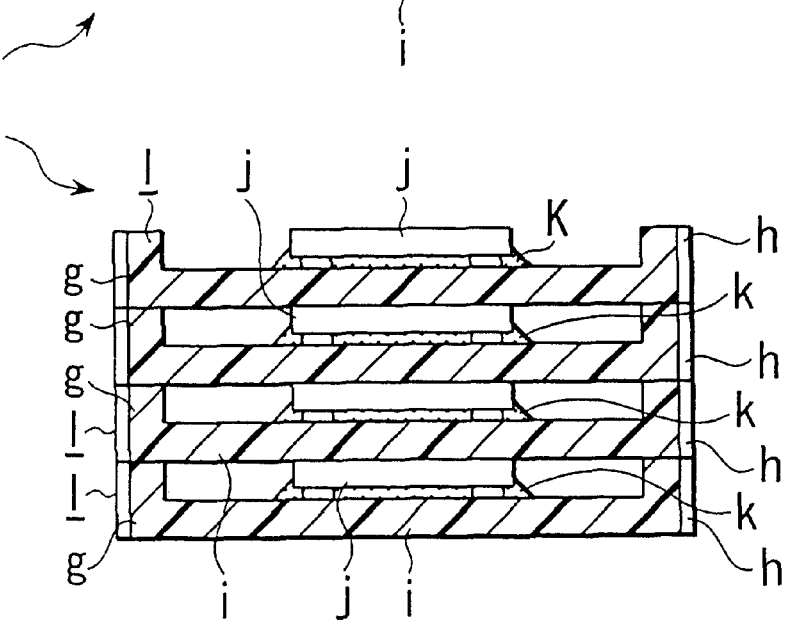

Next, the synthetic resin 14, the synthetic resin 11 and the semiconductor element 10 are polished and ground from the side of the back 10a of the semiconductor element 10 until the surface interconnection 5 is exposed (refer to FIG. 12). Further, etching or the like is carried out when needed.

Further, the semiconductor apparatus 1 is finished by carrying out nickel (Ni) plating, gold (Au) plating or solder plating on the surface interconnection 5 exposed at the surface.

According to the above-described semiconductor apparatus 1, the interconnection pattern 5 is formed to dispose in the plane the same as that of the back 10a of the semiconductor element 10 on the front and accordingly, the interconnection pattern 5 on the front can arbitrarily designed and reliability of connection in laminating layers is enhanced. Further, the semiconductor element 10 is mounted by disposing the front on the lower side and accordingly, a thickness of a total can be thinned by grinding the side of the back 10a.

Further, according to the above-described method of fabricating the semiconductor apparatus, the semiconductor element 10 is ground after having been covered by the synthetic resin 11 and therefore, stress is difficult to exert to the semiconductor element 10 and chipping or chip crack is difficult to cause.

Further, the thickness H1 of the front interconnection 5 of the base substrate 2' or 2" is made thicker than the thicknesses of the other interconnections 6 and 7 and accordingly, the surface interconnection 5 can firmly be exposed by absorbing dispersions in the thicknesses of the respective layers 3 and 4.

Further, shapes and structures of respective portions shown by the above-described embodiments, indicate only examples of implementation which is carried out in reducing the present invention into practice and the technical scope of the invention must not be interpreted limitedly thereby.

As apparent from the above-described, according to an aspect of the present invention, there is provided a semiconductor apparatus, wherein a semiconductor element is mounted in a recess portion formed at a surface of a substrate having interconnection patterns connected by a through hole on two of the surface and a back thereof with a front thereof disposed on a lower side, a semiconductor element is sealed in the recess portion by a synthetic resin, and the back of the semiconductor element and the interconnection on the front are disposed in a same plane.

Therefore, according to the semiconductor apparatus of the present invention, the interconnection pattern is formed on the front to dispose in a plane the same as that of the back of the semiconductor element and accordingly, the interconnection pattern on the front can arbitrarily be designed and reliability of connection in laminating layers is enhanced. Further, the semiconductor element is mounted by disposing the front on the lower side and accordingly, the thickness of the total can be thinned by grinding the back.

According to another aspect of the present invention, all of side faces of the semiconductor element are covered by the synthetic resin and accordingly, stress exerted to the semiconductor element in grinding for thinning the total can be alleviated and so-to-speak chipping or chip crack can be prevented from causing.

Further, according to another aspect of the present invention, there is provided a method of fabricating a semiconductor apparatus comprising a step of mounting a semiconductor element in a recess portion shallower than a thickness of the semiconductor element, the recess portion being formed in a surface of a substrate having interconnection patterns connected by a through hole on two of the surface and a back thereof in which a thickness of an interconnection on the surface is made thicker than a thickness of an interconnection on the back with a front thereof disposed on a lower side, a step of sealing the semiconductor element in the recess portion by a synthetic resin, and a step of grinding the substrate and the semiconductor element up to the interconnection on the surface.

Therefore, according to the method of fabricating a semiconductor apparatus of the present invention, the semiconductor element is mounted by disposing the front on the lower side and accordingly, the thickness of the total can be thinned by grinding the semiconductor element from the back. Further, the thickness of the interconnection on the front is thickened more than the thickness of the interconnection of the back and accordingly, when there is a dispersion in the thickness of the substrate, even when the thickness is ground such that the thickness of the total becomes the same, the interconnection can firmly be exposed to the front and reliability in connection can be promoted.

According to another aspect of the present invention, all side faces of the semiconductor element are covered by the synthetic resin in the step of sealing the semiconductor element and accordingly, stress exerted to the semiconductor element in grinding at the successive step can be alleviated and so-to-speak chipping or chip crack can be prevented from causing.

According to another aspect of the present invention, the synthetic resin is coated on the surface of substrate such that a height thereof becomes equal to or higher than a height of the semiconductor element after mounting the semiconductor element and accordingly, stress exerted to the semiconductor element in the grinding step can further be alleviated and so-to-speak chipping or chip crack can further firmly be prevented from causing.

What is claimed is:

1. A method of fabricating a semiconductor apparatus comprising the steps of:

mounting a semiconductor element in a recess portion of a substrate, said recess portion having a depth that is greater than or equal to a majority of the thickness of the semiconductor element;

sealing the semiconductor element in the recess portion by a synthetic resin,
   wherein the resin covers a majority of the side walls of the semiconductor element; and grinding the substrate and the semiconductor element up to an interconnection level of the substrate.

2. A method of fabricating a semiconductor apparatus according to claim 1, wherein all of side faces of the semiconductor element are completely covered by the synthetic resin in the step of sealing the semiconductor element.

3. A method of fabricating a semiconductor apparatus according to claim 2, wherein the synthetic resin is coated on the surface of the substrate such that a height thereof is equal to or higher than a height of the semiconductor element after mounting the semiconductor element.

4. A semiconductor apparatus, wherein a semiconductor element is mounted in a recess portion formed in a substrate;

a semiconductor element is sealed in the recess portion by a synthetic resin; and prior to initiation of grinding a back side of the semiconductor element, the semiconductor element is at least substantially surrounded with the synthetic resin.

5. A semiconductor apparatus according to claim 4, wherein all of side faces of the semiconductor element are completely covered by the synthetic resin.

* * * * *